(12) United States Patent
Shibata

(10) Patent No.: US 11,051,430 B2
(45) Date of Patent: Jun. 29, 2021

(54) ELECTRONIC CONTROL UNIT

(71) Applicant: DENSO CORPORATION, Kariya (JP)

(72) Inventor: Shinji Shibata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/090,169

(22) Filed: Apr. 4, 2016

(65) Prior Publication Data
US 2016/0295740 A1 Oct. 6, 2016

(30) Foreign Application Priority Data
Apr. 6, 2015 (JP) ................ JP2015-77728

(51) Int. Cl.
*H05K 7/20* (2006.01)

(52) U.S. Cl.
CPC ......... *H05K 7/20454* (2013.01); *H05K 7/209* (2013.01); *H05K 7/20472* (2013.01)

(58) Field of Classification Search
CPC ............ H05K 7/20454; H05K 1/0203; H05K 7/20854; H05K 2201/066; H05K 7/2039; H05K 7/209; H05K 7/205; H05K 7/20909; H05K 6/20963; H05K 7/20472
See application file for complete search history.

(56) References Cited

U.S. PATENT DOCUMENTS

| | | | | |
|---|---|---|---|---|
| 5,208,733 A * | 5/1993 | Besanger | ............... | H05K 3/284 165/185 |
| 5,245,508 A * | 9/1993 | Mizzi | ................. | H05K 7/20454 165/185 |
| 5,373,418 A | 12/1994 | Hayasi | | |
| 6,031,732 A * | 2/2000 | Koike | ................ | H05K 9/0039 174/377 |
| 6,043,983 A * | 3/2000 | Taylor | ................ | H05K 9/0033 174/351 |
| 6,549,409 B1 * | 4/2003 | Saxelby, Jr. | ......... | H05K 1/0203 165/185 |
| 6,577,504 B1 | 6/2003 | Lofland et al. | | |
| 6,724,631 B2 * | 4/2004 | Ye | ........................... | H01L 23/36 257/707 |
| 7,576,988 B2 * | 8/2009 | Schwarz | ............ | H05K 7/20454 361/704 |
| 8,587,945 B1 * | 11/2013 | Hartmann | .......... | H05K 7/20454 361/679.53 |
| 2006/0171127 A1 | 8/2006 | Kadoya et al. | | |

(Continued)

FOREIGN PATENT DOCUMENTS

| JP | H06-224334 | 8/1994 |
|---|---|---|
| JP | 2005-142292 | 5/2005 |

(Continued)

*Primary Examiner* — James Wu
*Assistant Examiner* — Hung Q Dang
(74) *Attorney, Agent, or Firm* — Maschoff Brennan

(57) ABSTRACT

An electronic control unit includes a substrate, a plurality of electronic components, and a heat sink. The plurality of electronic components are mounted on the substrate, and include an integrated circuit and a plurality of tall components. The plurality of tall components are taller than the integrated circuit. The heat sink includes a recess collectively accommodating the plurality of tall components, and is provided on a side on which the plurality of tall components are mounted on the substrate.

22 Claims, 10 Drawing Sheets

(56) References Cited

U.S. PATENT DOCUMENTS

| | | |
|---|---|---|
| 2011/0013370 A1 | 1/2011 | Oota |
| 2011/0067945 A1* | 3/2011 | Sonoda ............... B62D 5/0406 |
| | | 180/444 |
| 2011/0090625 A1 | 4/2011 | Oota |
| 2012/0039054 A1 | 2/2012 | Oota |
| 2012/0057318 A1 | 3/2012 | Oota |
| 2013/0003306 A1* | 1/2013 | Oota .................. H01L 23/4006 |
| | | 361/709 |
| 2013/0300222 A1 | 11/2013 | Nakano et al. |
| 2014/0376188 A1 | 12/2014 | Morino |
| 2015/0189733 A1* | 7/2015 | Shibata ............... H05K 7/2039 |
| | | 701/41 |
| 2015/0189734 A1* | 7/2015 | Nishimoto ........... H05K 7/1432 |
| | | 701/41 |
| 2015/0189794 A1* | 7/2015 | Tashima ............... B62D 5/0406 |
| | | 180/446 |
| 2016/0021789 A1* | 1/2016 | Negishi ............... H01L 23/3675 |
| | | 361/714 |
| 2016/0036303 A1 | 2/2016 | Kadoike et al. |
| 2016/0106010 A1* | 4/2016 | Ito ...................... H05K 7/20854 |
| | | 361/707 |

FOREIGN PATENT DOCUMENTS

| | | |
|---|---|---|
| JP | 2007-228691 | 9/2007 |
| JP | 2009-123812 | 6/2009 |
| JP | 2013-149958 A | 8/2013 |

\* cited by examiner

ELECTRONIC CONTROL UNIT

CROSS REFERENCE TO RELATED APPLICATION

This application is based on Japanese Patent Application No. 2015-77728 filed on Apr. 6, 2015, the disclosure of which is incorporated herein by reference.

TECHNICAL FIELD

The present disclosure relates to an electronic control unit.

BACKGROUND

There has been known an electronic control unit that controls operation of a motor used in an electromotive power steering system. An electronic control unit of JP5414944B2 includes a plurality of capacitors and coils on one surface side of a substrate, and a heat sink on a side corresponding to the surface side. The heat sink includes a plurality of recesses each accommodating one each of the capacitors and of the coils.

However, the heat sink in the electronic control unit of JP5414944B2 has recesses as many as the capacitors or the coils, leading to a complicated configuration of the heat sink and high production cost.

SUMMARY

The present disclosure addresses at least one of the above issues. Thus, it is an objective of the present disclosure to provide an electronic control unit capable of reducing body size and simplifying a heat sink configuration.

To achieve the objective of the present disclosure, there is provided an electronic control unit including a substrate, a plurality of electronic components, and a heat sink. The plurality of electronic components are mounted on the substrate, and include an integrated circuit and a plurality of tall components. The plurality of tall components are taller than the integrated circuit. The heat sink includes a recess collectively accommodating the plurality of tall components, and is provided on a side on which the plurality of tall components are mounted on the substrate.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Hereinafter, an electronic control unit according to the disclosure is described with reference to the accompanying drawings. In the following embodiments, substantially the same configuration is designated by the same numeral, and duplicated description is omitted.

First Embodiment

Figure 1:
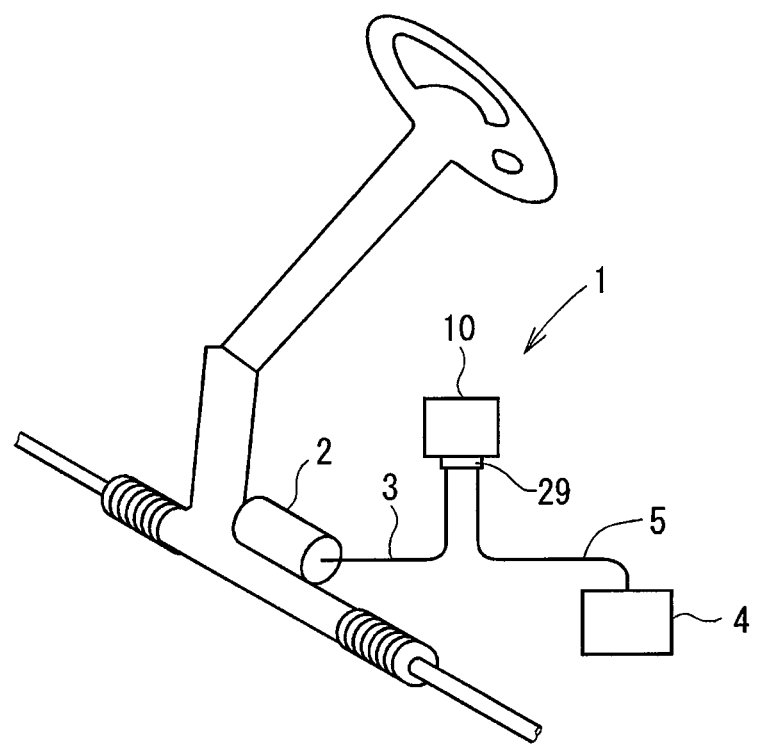
FIG. 1 is a schematic illustration of an electromotive power steering system according to a first embodiment.

A first embodiment is described with reference to FIGS. 1 to 4. In the first embodiment, described is an electronic control unit 10 used in an electromotive power steering system 1 of a vehicle. A configuration of the electromotive power steering system 1 is now described. As illustrated in FIG. 1, the electromotive power steering system 1 includes an electronic control unit 10 that is connected to a motor 2 by a harness 3 and connected to a battery 4 as a power supply by a harness 5. The electronic control unit 10 controls operation of the motor 2 according to a steering torque signal, a vehicle speed signal, and the like transmitted from a controller area network (CAN) of a vehicle, or the like. Thus, the motor 2 generates assist torque assisting steering by a driver. The motor 2 is a DC brush motor.

Figure 2:
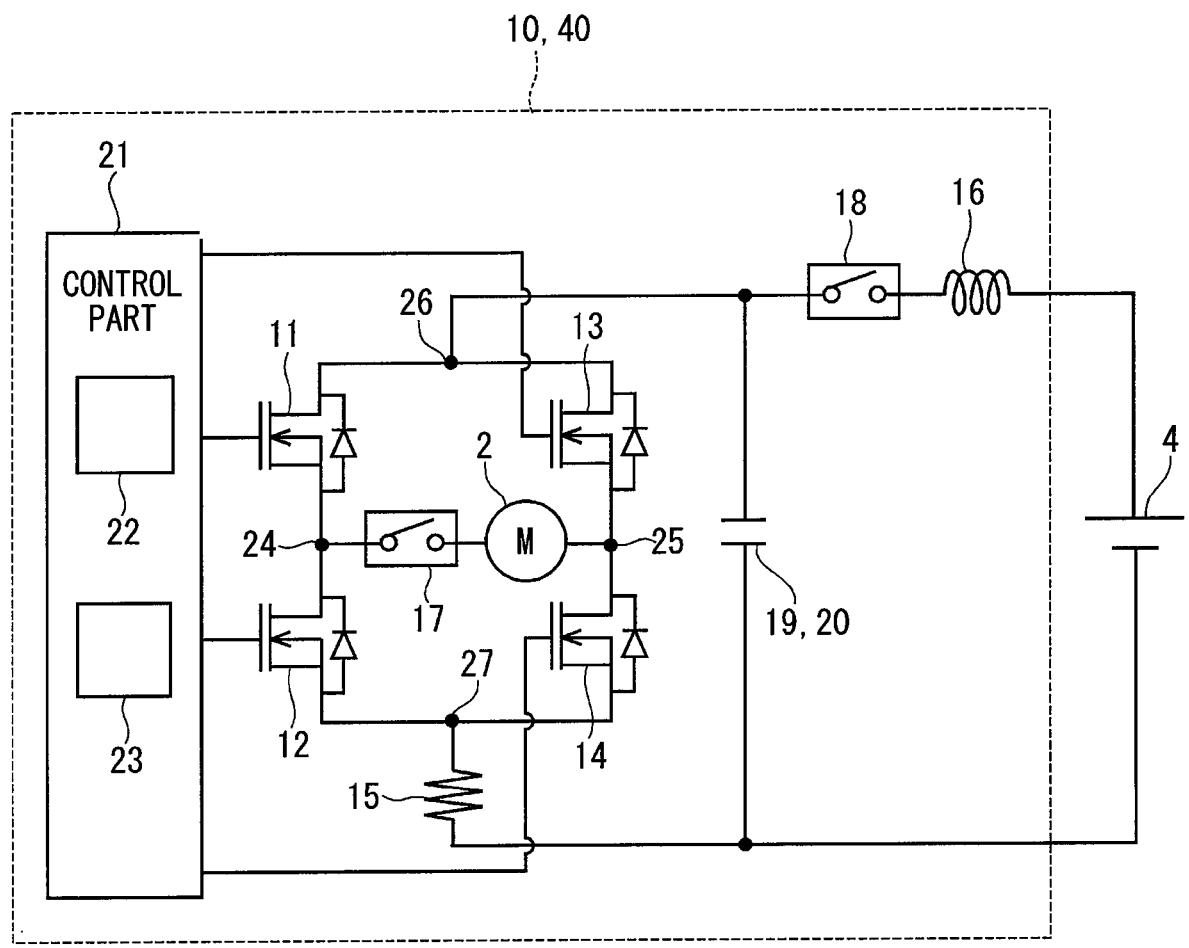
FIG. 2 is a circuit diagram of an electronic control unit of the first embodiment.

A circuit configuration of the electronic control unit 10 is now described. As illustrated in FIG. 2, the circuit of the electronic control unit 10 is configured of a plurality of electronic components including switching elements 11 to 14, a shunt resistance 15, a coil 16, relays 17 and 18, capacitors 19 and 20, a microcomputer 23, and a custom IC 22 as an integrated circuit. In the first embodiment, some of the electronic components, such as the shunt resistance 15, the coil 16, the relays 17 and 18, and the capacitors 19 and 20, are taller than the custom IC 22, and are each referred to as "tall component". In the first embodiment, the switching elements 11 to 14 are each a metal-oxide-semiconductor field-effect transistor (MOSFET) shorter than the custom IC 22. The switching elements 11 to 14 may each be one of various semiconductor switching elements such as an insulated gate bipolar transistor (IGBT).

The switching elements 11 to 14 configure an H bridge circuit. Specifically, the two switching elements 11 and 12 connected in series are connected in parallel with the two switching elements 13 and 14 connected in series. The motor 2 and the mechanical motor relay 17 are connected in series between a node 24 of the switching element 11 on a high potential side and the switching element 12 on a low potential side and a node 25 of the switching element 13 on the high potential side and the switching element 14 on the low potential side.

A node 26 of the switching element 11 on the high potential side and the switching element 13 on the high potential side is connected to the positive electrode of the battery 4 via the coil 16 and the mechanical power relay 18. The coil 16 is, for example, a chalk coil and reduces noise. A node 27 of the switching element 12 on the low potential side and the switching element 14 on the low potential side is connected to the negative electrode of the battery 4 via the shunt resistance 15. The shunt resistance 15 is used to detect a current applied to the motor 2.

The capacitors 19 and 20 are each, for example, an aluminium electrolytic capacitor, and are connected in parallel with the series-connected high-potential-side switching elements 11, 13 and low-potential-side switching elements 12, 14. The capacitors 19 and 20 each store electrical charges, and thereby assists power supply to the switching elements 11 to 14, or suppresses noise components such as surge voltage. Specifically, the switching elements 11 to 14, the shunt resistance 15, the coil 16, the relays 17 and 18, and the capacitors 19 and 20 configure a circuit that applies a large current from the battery 4 to the motor 2.

A control part 21 is configured of the microcomputer 23 and the custom IC 22. The control part 21 controls ON/OFF operation of each of the switching elements 11 to 14 and the relays 17 and 18 according to signals from sensors provided in various parts of a vehicle, and thereby controls operation of the motor 2.

Figure 3:
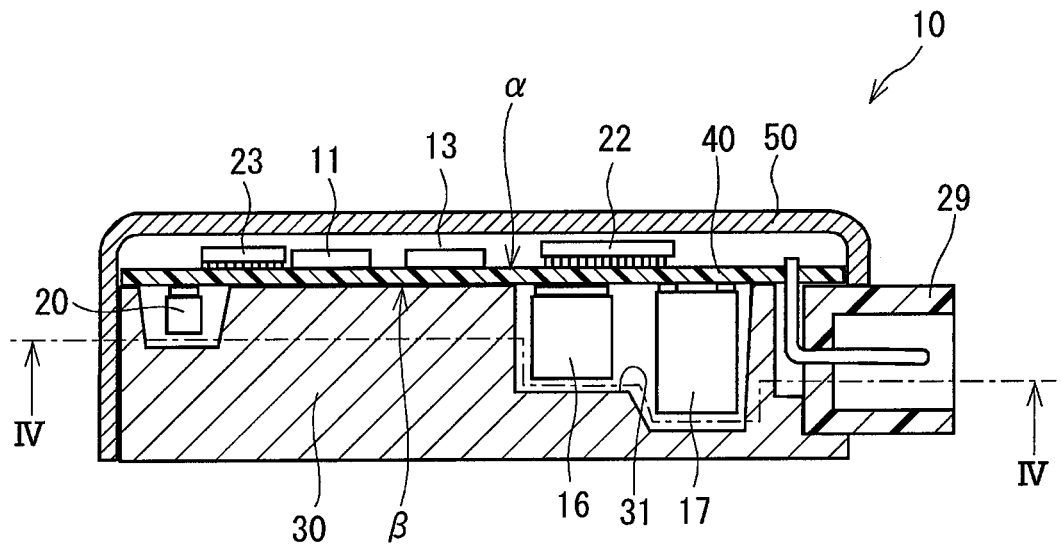
FIG. 3 is a sectional view of the electronic control unit of the first embodiment.
Figure 4:
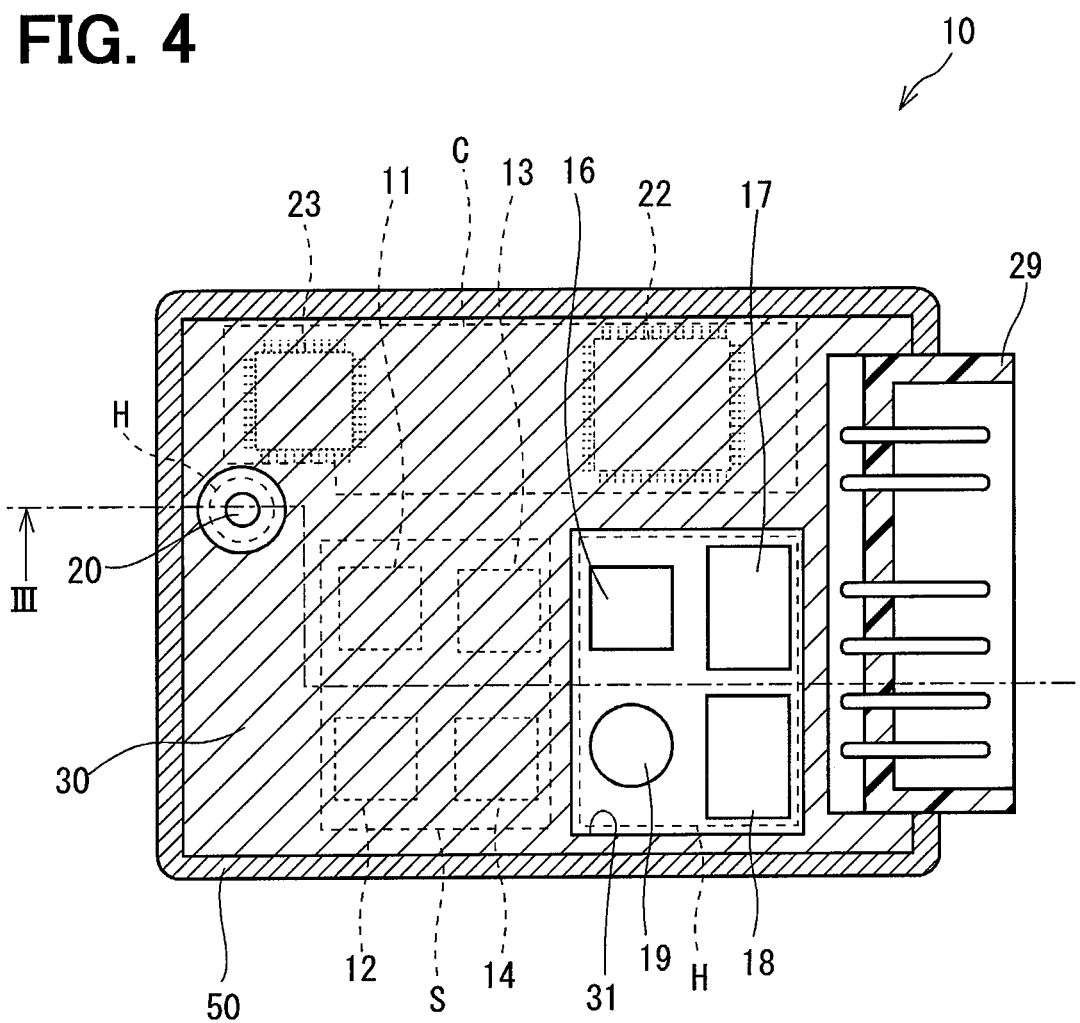
FIG. 4 is a sectional view along a line IV-IV in FIG. 3.

The configuration of the electronic control unit 10 is now described. As illustrated in FIGS. 3 and 4, the electronic control unit 10 includes the electronic components 11 to 23, a substrate 40, a heat sink 30, and a cover 50. The substrate 40, such as a FR-4 substrate, has an interconnection pattern, and has a surface on which a plurality of electronic components 11 to 23 are mounted. The custom IC 22, the microcomputer 23, and four switching elements 11 to 14 are mounted on a surface α of the substrate 40 on a side close to the cover 50. The coil 16, the motor relay 17, the power relay 18, the capacitors 19 and 20, and a connector 29 are mounted on a surface β of the substrate 40 on a side close to the heat sink 30.

A tall region H is a region in which tall components 16 to 20, such as the coil 16, the motor relay 17, the power relay 18, and the capacitors 19 and 20, are mounted on the substrate 40. A switching region S is a region in which the four switching elements 11 to 14 are mounted on the substrate 40. A control region C is a region in which a control part 21 including the custom IC 22 and the microcomputer 23 is mounted on the substrate 40. In FIG. 4, an example of each of the tall region H, the switching region S, and the control region C are schematically shown by a broken line. In the first embodiment, the tall region H is provided on the surface β of the substrate 40 on the side close to the heat sink 30, while the switching region S and the control region C are provided on the surface α of the substrate 40 on the side close to the cover 50. Specifically, the tall components 16 to 20 are collectively provided in a particular portion of the surface β of the substrate 40 on the side close to the heat sink 30. The tall region H, the switching region S, the control region C, and a layout of the electronic components 11 to 23 mounted in each region are not limitative but illustrative.

The heat sink 30 is formed of metal such as aluminum, and is provided on the side on which the tall components 16 to 20 are mounted on the substrate 40. The heat sink 30 has a recess 31 collectively accommodating the tall components 16 to 20 at a place corresponding to the tall region H of the substrate 40. The recess 31 surrounds the entire periphery of the tall components 16 to 20 except for a periphery side close to the substrate 40. Consequently, the heat sink 30 can block leakage of electromagnetic waves, which are emitted from the tall components 16 to 20, to the outside. The heat sink 30 can radiate heat that is generated by the tall components 16 to 20 when power is supplied to the components. The cover 50 is formed into a closed-end cylindrical shape with resin or metal, and is provided on the side of the substrate 40 opposite to the side close to the heat sink 30. The cover 50 is fixed to the heat sink 30, and covers the substrate 40 and the components such as the custom IC 22 and the microcomputer 23 mounted on the substrate 40.

The electronic control unit 10 of the first embodiment exhibits the following functions and effects. (1) In the first embodiment, the heat sink 30 is provided on the side on which the tall components 16 to 20 are mounted on the substrate 40, and has the recess 31 collectively accommodating the tall components 16 to 20. Consequently, the tall components 16 to 20 are provided within the limits of the height of the heat sink 30, which makes it possible to reduce the size of the electronic control unit 10. The heat sink 30 collectively accommodates the tall components 16 to 20 in the recess 31, which makes it possible to simplify a configuration of the heat sink 30 and reduce production cost. Furthermore, since the tall components 16 to 20 may each have any body size within the limits of the height of the heat sink 30, performance of the tall components 16 to 20 can be maintained. The height of the heat sink 30 is larger than any of heights of the tall components 16 to 20, which makes it possible to increase radiation. In addition, this results in a small distance between the tall components 16 to 20 and the heat sink 30; hence, it is possible to increase radiation from the tall components 16 to 20 to the heat sink 30.

(2) In the first embodiment, the recess 31 of the heat sink 30 surrounds the entire periphery of the tall components 16 to 20 except for the periphery side close to the substrate 40. Thus, the heat sink 30 blocks the electromagnetic waves emitted from the tall components 16 to 20, which makes it possible to reduce noise caused by the electronic control unit 10. In addition, the heat sink 30 surrounds the periphery of the tall components 16 to 20, which makes it possible to increase radiation from the tall components 16 to 20 to the heat sink 30.

(3) In the first embodiment, the switching elements 11 to 14 are mounted on the surface of the substrate 40 on the side opposite to the side close to the heat sink 30. This makes it possible to simplify the configuration of the heat sink 30 without need of a recess accommodating the switching elements 11 to 14 and thus reduce production cost.

(4) In the first embodiment, the electronic control unit 10 controls operation of the motor 2 of the electromotive power steering system 1. The electronic control unit 10 satisfies a requirement of a small body size required for the electromotive power steering system 1, and satisfies a requirement of increasing radiation from the electronic components 11 to 20 that greatly generate heat when power is supplied thereto.

(5) In the first embodiment, the heat sink 30 has the recess 31 at the place corresponding to the tall region H of the substrate 40. Thus, the tall components 16 to 20 are collectively disposed in the tall region H of the substrate 40, and the recess 31 of the heat sink 30 is provided in the corresponding portion, which makes it possible to simplify a configuration of the heat sink 30.

Second Embodiment

Figure 5:
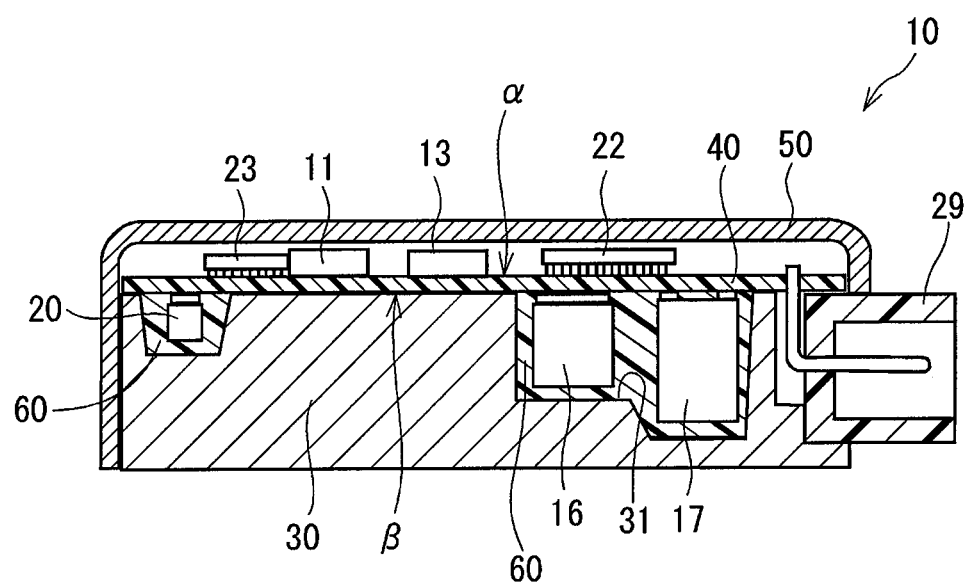
FIG. 5 is a sectional view of an electronic control unit of a second embodiment.

A second embodiment is shown in FIG. 5. In the second embodiment, a heat conduction component 60 is provided between the tall components 16 to 20 mounted on the substrate 40 and the inner wall of the recess 31 of the heat sink 30. The heat conduction component 60 is a radiating gel or a radiating sheet, for example. While heat is generated by the tall components 16 to 20 when power is supplied to the components, the heat is radiated to the heat sink 30 via the heat conduction component 60. In the second embodiment, it is therefore possible to increase radiation from the tall components 16 to 20 to the heat sink 30 by the heat conduction component 60.

Third Embodiment

Figure 6:
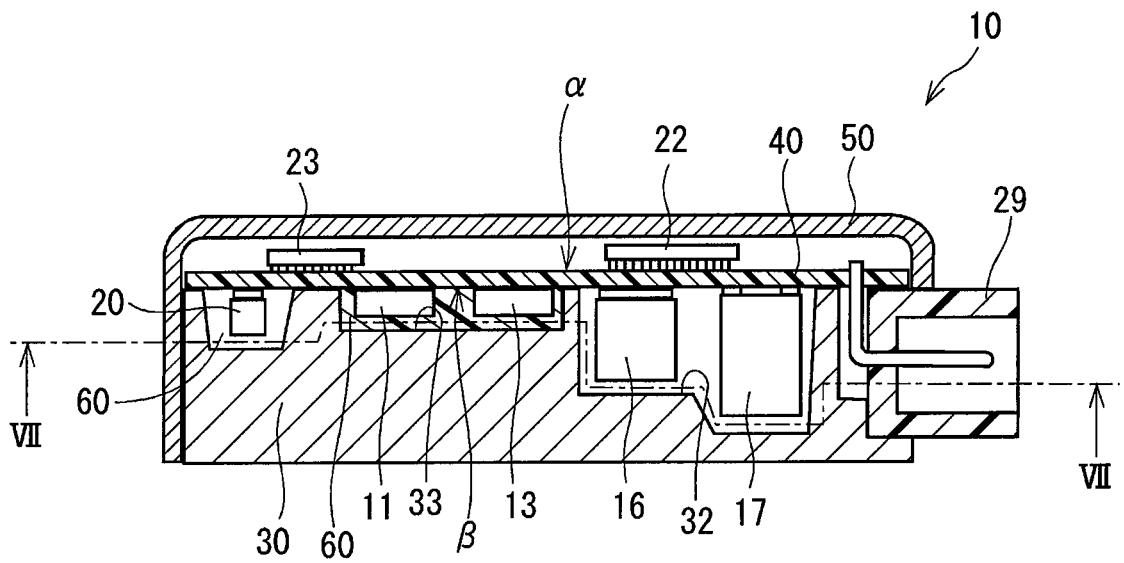
FIG. 6 is a sectional view of an electronic control unit of a third embodiment.
Figure 7:
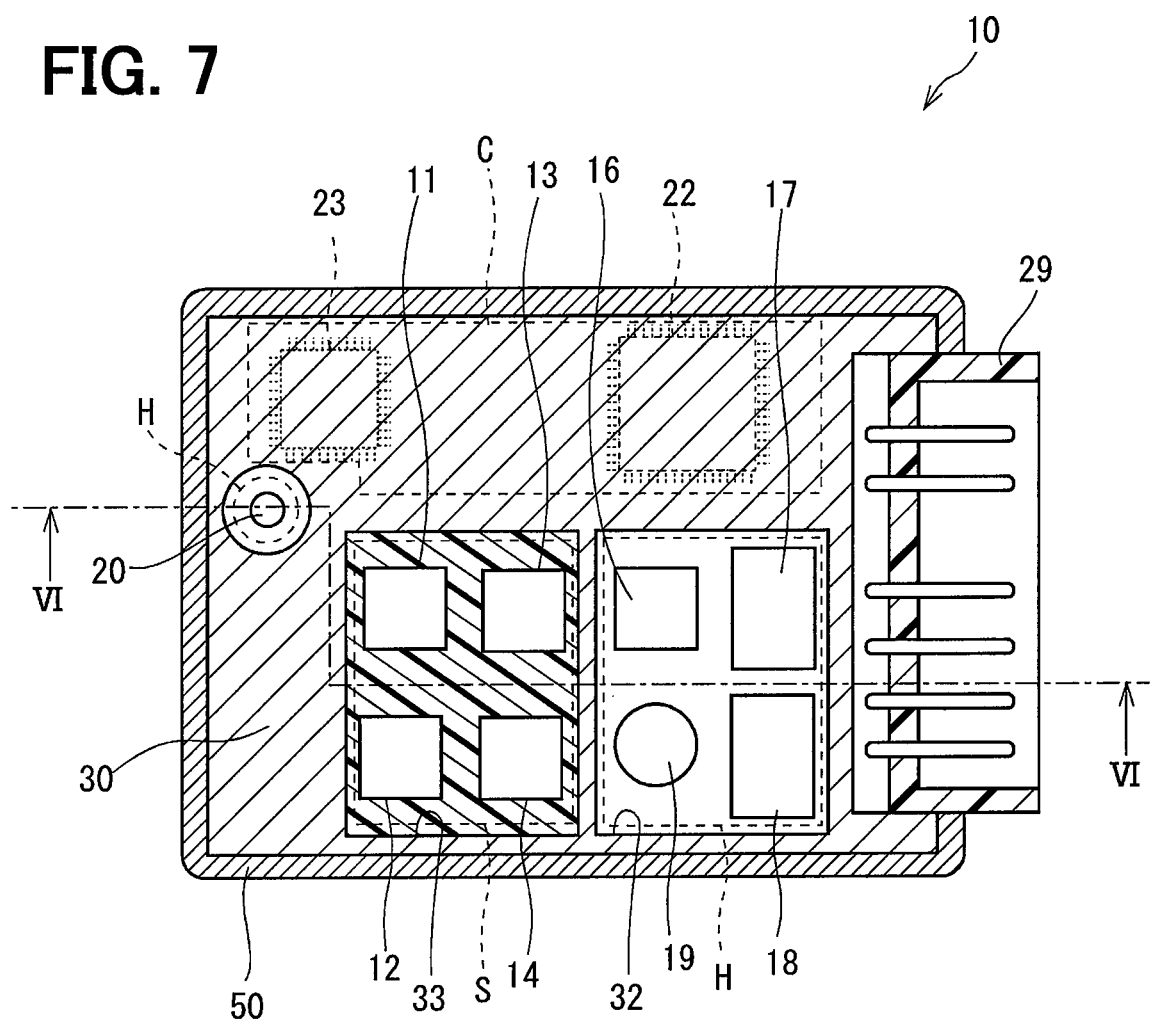
FIG. 7 is a sectional view along a line VII-VII in FIG. 6.

A third embodiment is shown in FIGS. 6 and 7. In the third embodiment, the custom IC 22 and the microcomputer 23 are mounted on the surface α of the substrate 40 on a side close to the cover 50. The four switching elements 11 to 14 and the tall components 16 to 20 are mounted on the surface β of the substrate 40 on a side close to the heat sink 30. Hence, in the third embodiment, the control region C is provided in the surface α of the substrate 40 on the side close to the cover 50, and the switching region S and the tall region H are provided in the surface β of the substrate 40 on the side close to the heat sink 30.

The heat sink 30 has a first recess 32 at a place corresponding to the tall region H of the substrate 40, and has a second recess 33 at a place corresponding to the switching region S of the substrate 40. As with the recess 31 in the first and second embodiments, the first recess 32 surrounds the entire periphery of the tall components 16 to 20 except for the periphery side close to the substrate 40. The second recess 33 surrounds the entire periphery of the switching elements 11 to 14 except for a periphery side close to the substrate 40. Consequently, the heat sink 30 can block leakage of electromagnetic waves, which are emitted from the tall components 16 to 20 and the switching elements 11 to 14, to the outside. While heat is generated by the tall components 16 to 20 and the switching elements 11 to 14 when power is supplied thereto, the heat sink 30 can radiate the heat.

In the third embodiment, the heat conduction component 60 is provided between the respective switching elements 11 to 14 mounted on the substrate 40 and the inner wall of the second recess 33 of the heat sink 30. While heat is generated by the switching elements 11 to 14 when power is supplied to the elements, the heat is radiated to the heat sink 30 via the heat conduction component 60. In the third embodiment, it is therefore possible to increase radiation from the switching elements 11 to 14 to the heat sink 30.

Fourth Embodiment

Figure 8:
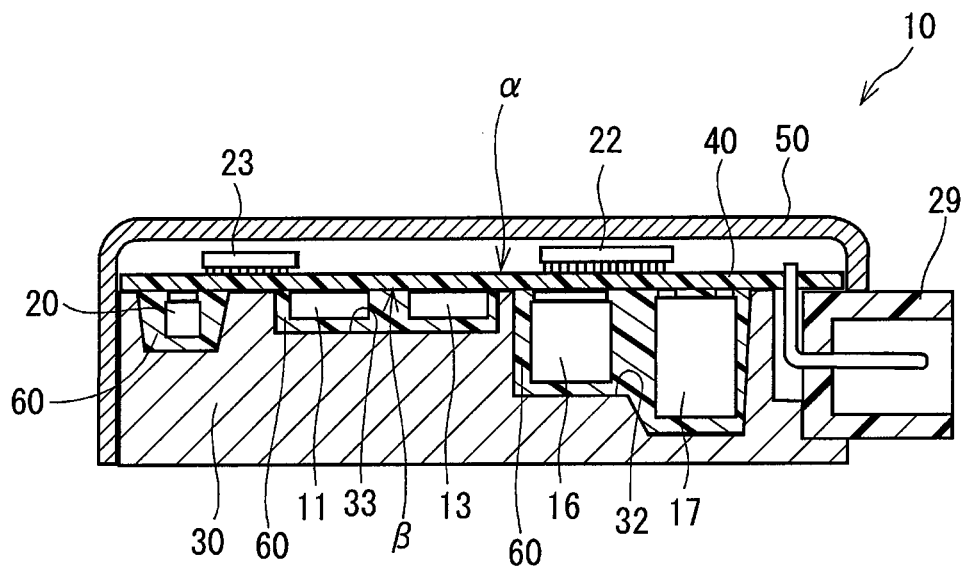
FIG. 8 is a sectional view of an electronic control unit of a fourth embodiment.

A fourth embodiment is shown in FIG. 8. In the fourth embodiment, the heat conduction component 60 is provided between the respective tall components 16 to 20 mounted on the substrate 40 and the inner wall of the first recess 32 of the heat sink 30. The heat conduction component 60 is also provided between the respective switching elements 11 to 14 mounted on the substrate 40 and the inner wall of the second recess 33 of the heat sink 30. While heat is generated by the tall components 16 to 20 when power is supplied to the components, the heat is radiated to the heat sink 30 via the heat conduction component 60. While heat is generated by the switching elements 11 to 14 when power is supplied to the elements, the heat is radiated to the heat sink 30 via the heat conduction component 60. In the fourth embodiment, it is therefore possible to increase radiation from the tall components 16 to 20 and the switching elements 11 to 14 to the heat sink 30.

Fifth Embodiment

Figure 9:
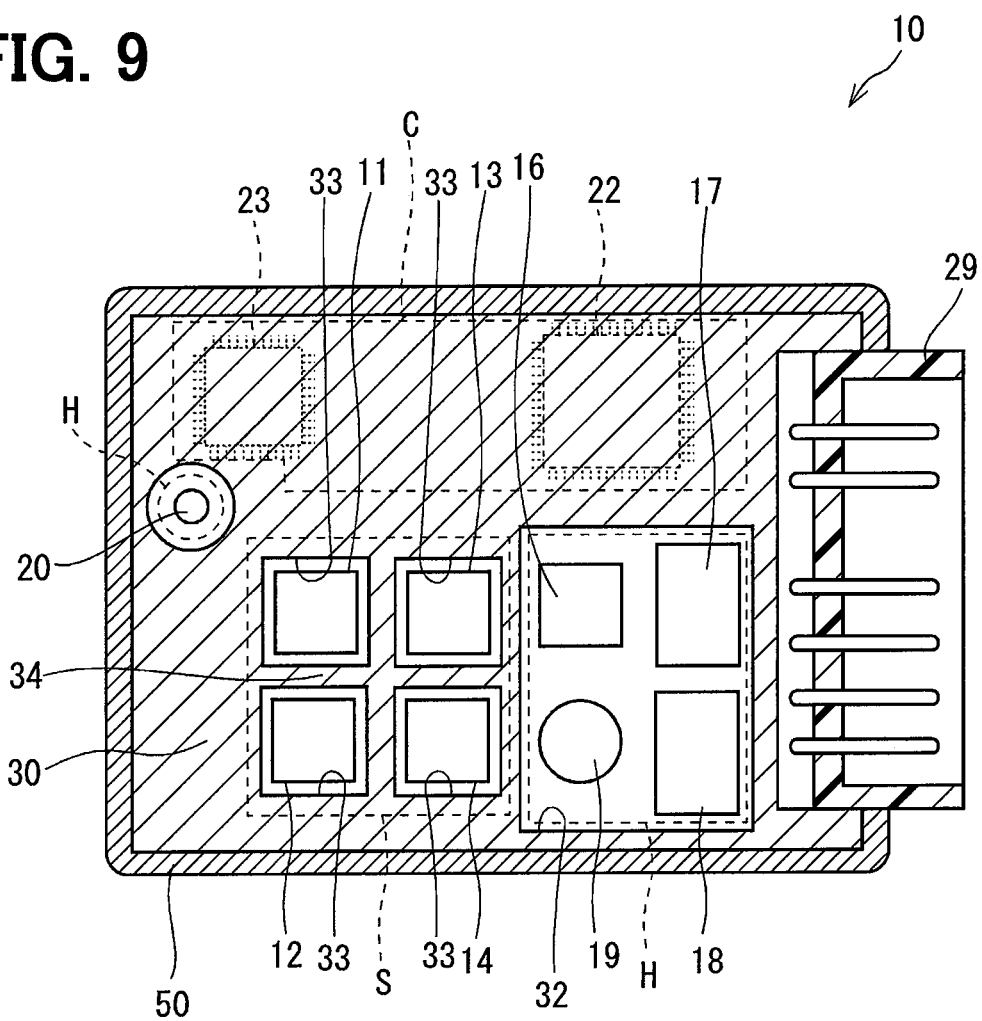
FIG. 9 is a sectional view of an electronic control unit of a fifth embodiment.

A fifth embodiment is shown in FIG. 9. In the fifth embodiment, four second recesses 33 are provided in correspondence to the respective four switching elements 11 to 14. A cross-shaped partition wall 34 is provided between the four second recesses 33. This decreases a distance between each of the switching elements 11 to 14 and the inner wall of the second recess 33. As a result, while heat is generated by the switching elements 11 to 14 when power is supplied to the elements, the heat is radiated to the heat sink 30 through the inner walls of the four second recesses 33 provided in correspondence to the respective switching elements 11 to 14. In the fifth embodiment, it is therefore possible to increase radiation from the switching elements 11 to 14 to the heat sink 30.

Sixth Embodiment

Figure 10:
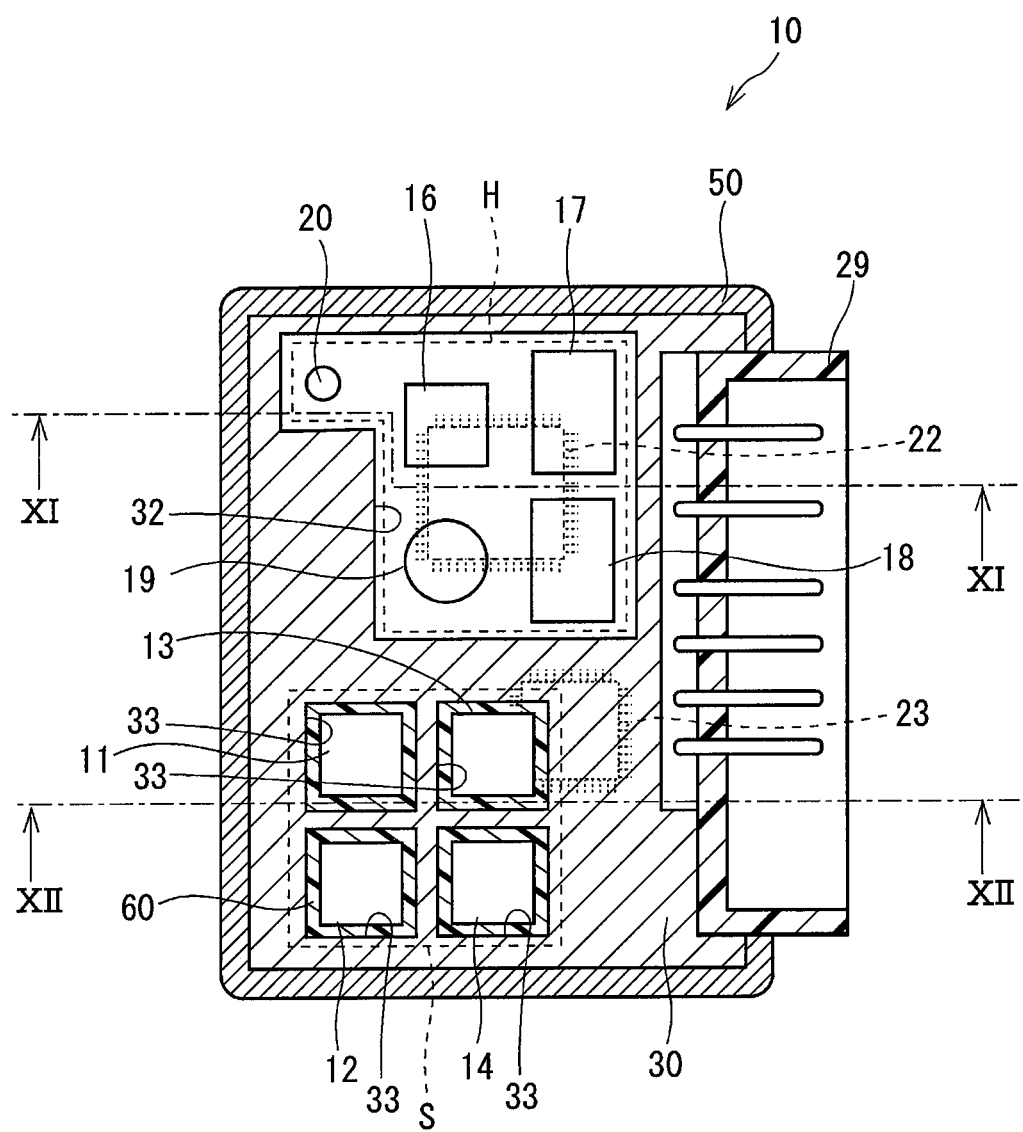
FIG. 10 is a sectional view of an electronic control unit of a sixth embodiment.
Figure 11:
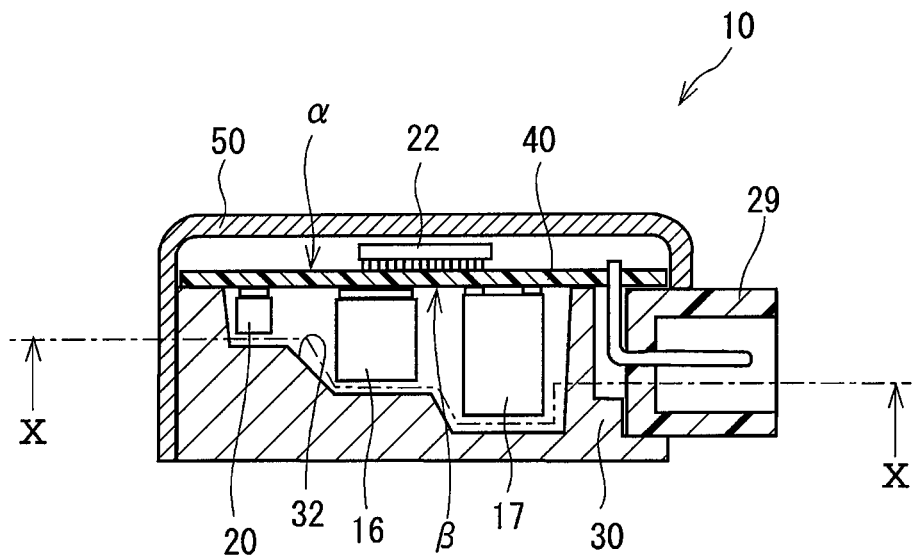
FIG. 11 is a sectional view along a line XI-XI in FIG. 10.
Figure 12:
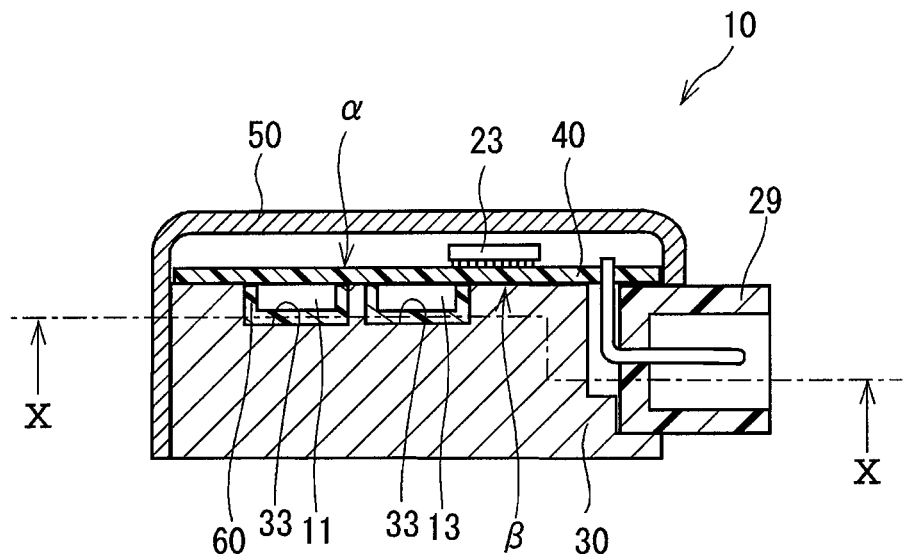
FIG. 12 is a sectional view along a line XII-XII in FIG. 10.

A sixth embodiment is shown in FIGS. 10 to 12. In the sixth embodiment, the connector 29 is provided in a longitudinal direction of the substrate 40. The substrate 40 has the switching region S in one longitudinal area of the surface β on the side close to the heat sink 30 and the tall region H in the other longitudinal area thereof. The coil 16, the motor relay 17, the power relay 18, and the two capacitors 19 and 20 are collectively provided in the tall region H. The heat sink 30 has one first recess 32 in a portion corresponding to the tall region H of the substrate 40, and four second recesses 33 in a portion corresponding to the switching region S of the substrate 40. The heat conduction component 60 is provided between the four switching elements 11 to 14 and the respective inner walls of the four second recesses 33. The sixth embodiment can also exhibit functions and effects similar to those in the first to fifth embodiments.

Seventh Embodiment

Figure 13:
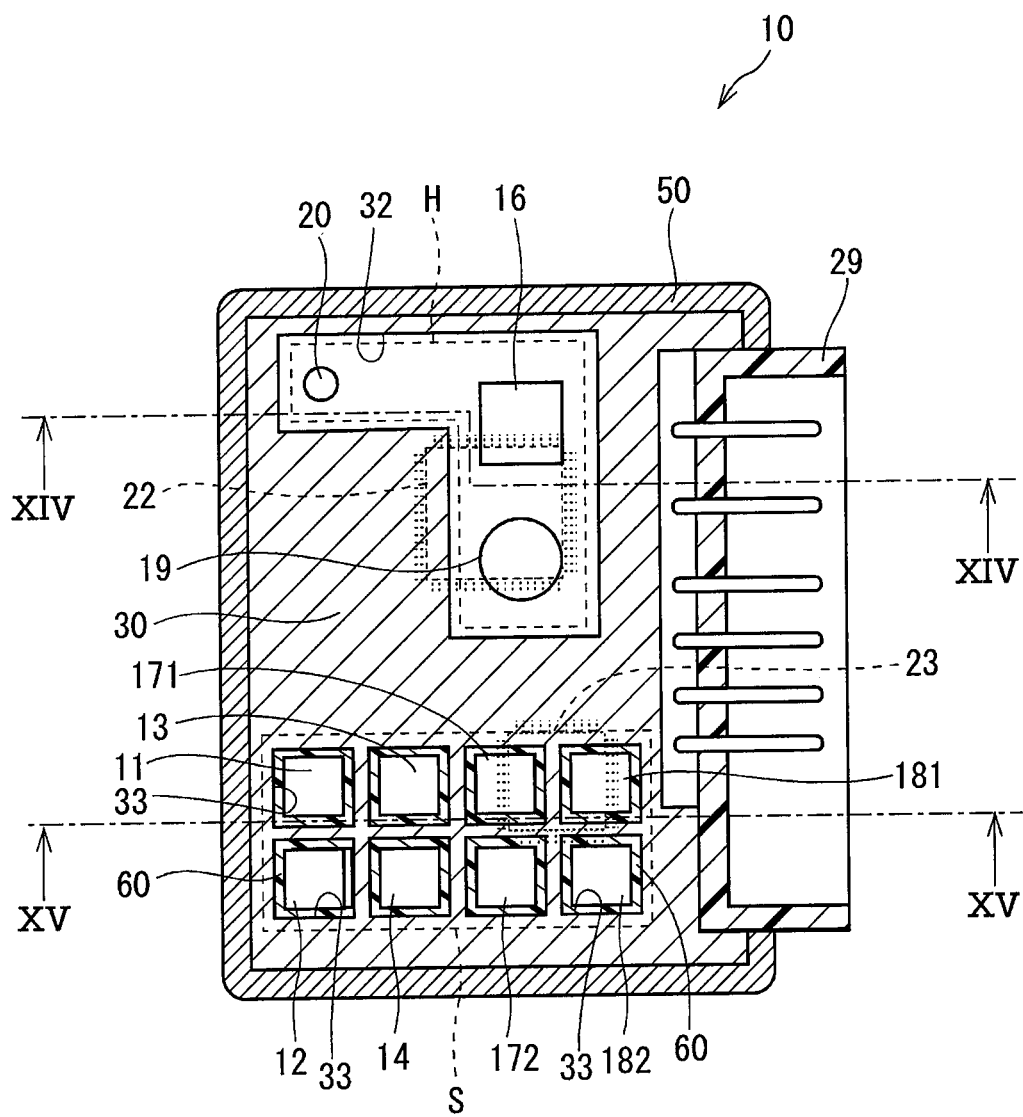
FIG. 13 is a sectional view of an electronic control unit of a seventh embodiment.
Figure 14:
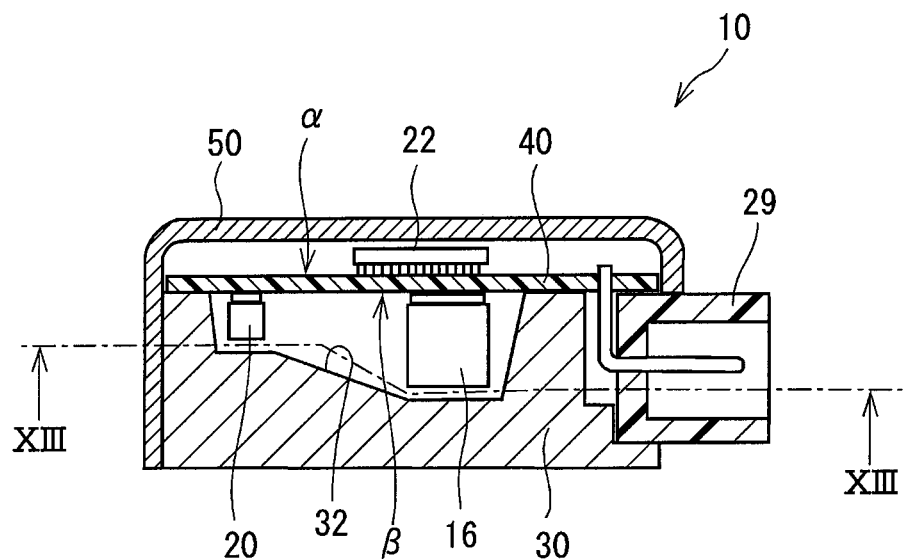
FIG. 14 is a sectional view along a line XIV-XIV in FIG. 13.
Figure 15:
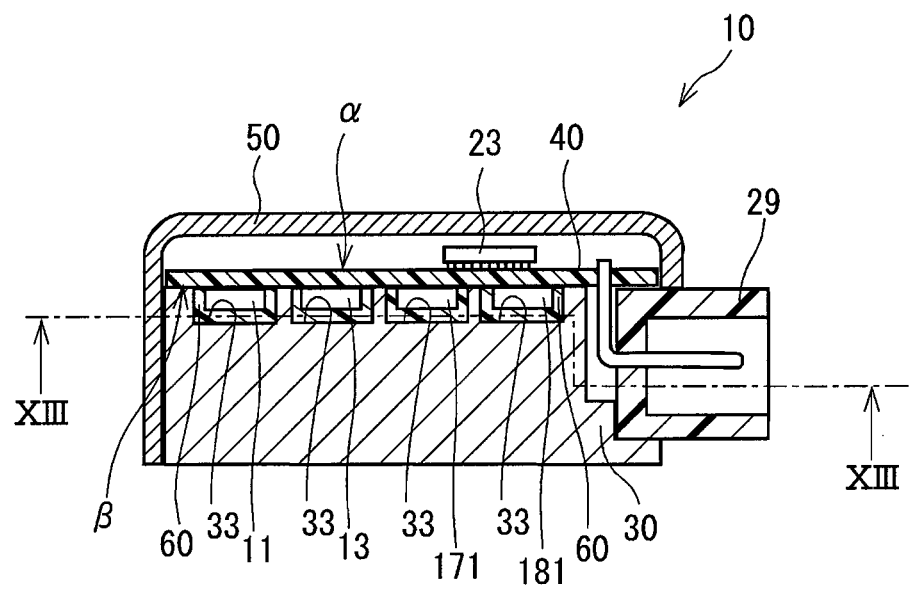
FIG. 15 is a sectional view along a line XV-XV in FIG. 13.

A seventh embodiment is shown in FIGS. 13 to 15. In the seventh embodiment, switching elements 171 and 172 including MOSFET or the like are provided in place of the mechanical motor relay 17. The two switching elements 171 and 172 are connected in series such that they have opposite emitter directions and opposite collector directions, in order not to cause troubles due to reverse connection. In the seventh embodiment, switching elements 181 and 182 including MOSFET or the like are provided in place of the mechanical power relay 18. The two switching elements 181 and 182 are also connected in series such that their emitter directions and collector directions are each opposite to each other.

In the seventh embodiment, eight switching elements 11 to 14, 171, 172, 181, and 182 are provided in the switching region S provided in the surface β of the substrate 40 on the side close to the heat sink 30. The heat conduction component 60 is provided between the respective switching elements 11 to 14, 171, 172, 181, and 182 and the inner walls of the eight second recesses 33 provided in the heat sink 30. The seventh embodiment can also exhibit functions and effects similar to those in the first to sixth embodiments.

Modifications to the above first to seventh embodiments will be described below. (1) In the above-described embodiments, the electronic control unit 10 includes the H bridge circuit configured of the four switching elements 11 to 14 and drives the DC motor 2 thereby. In a modification, the electronic control unit 10 may include an inverter circuit configured of, for example, six switching elements to drive a brushless motor.

(2) In the above-described embodiments, described is the electronic control unit 10 that is provided at a position away from the motor 2 of the electromotive power steering system 1 and controls the motor 2. In a modification, the electronic control unit 10 may be provided integrally with the motor 2. Furthermore, in a modification, the electronic control unit 10 should not limitedly control the electromotive power steering system 1, and may control various other systems. As described above, the present disclosure is not limited to the above-described embodiments, and can be carried out in various modes within the scope without departing from the gist of the disclosure.

To sum up, the electronic control unit 10 of the above embodiments can be described as follows.

An electronic control unit 10 includes a substrate 40, a plurality of electronic components 11-23, and a heat sink 30. The plurality of electronic components 11-23 are mounted on the substrate 40, and include an integrated circuit 22 and a plurality of tall components 16-20. The plurality of tall components 16-20 are taller than the integrated circuit 22. The heat sink 30 includes a recess 31, 32 collectively accommodating the plurality of tall components 16-20, and is provided on a side on which the plurality of tall components 16-20 are mounted on the substrate 40. Thus, the tall components 16-20 and the heat sink 30 are provided on the same surface side of the substrate 40, which makes it possible to reduce the size of the electronic control unit 10. The heat sink 30 collectively accommodates the tall components 16-20 in the recess 31, 32, which makes it possible to simplify a configuration of the heat sink 30 and reduce production cost.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electronic control unit comprising:
    a substrate;
    a plurality of electronic components that are mounted on the substrate and include:
        an integrated circuit;
        a semiconductor switching element; and
        a plurality of tall components that are taller than the integrated circuit and the semiconductor switching element;
    a heat sink formed from metal positioned on and contacting a first surface of the substrate;
    a cover positioned over a second surface of the substrate that is opposite to the first surface and configured to cover the second surface of the substrate, and
    a connector positioned on the first surface of the substrate, wherein
    the plurality of tall components and the semiconductor switching element are mounted on the first surface of the substrate,
    the plurality of tall components includes at least one of a coil, a mechanical relay, and a capacitor,
    the heat sink comprises a first recess, a second recess, and a third recess,
    the first recess faces the first surface of the substrate and is configured to receive the plurality of tall components,
    the second recess faces the first surface of the substrate and is configured to receive the semiconductor switching element,
    the third recess faces the first surface of the substrate and is configured to receive the connector,
    the first recess comprises a first depth, which is defined as a distance in a thickness direction of the heat sink from a surface of the heat sink that contacts the substrate to a surface of the first recess that faces the substrate,
    the second recess comprises a second depth, which is defined as a distance in the thickness direction of the heat sink from a surface of the heat sink that contacts the substrate to a surface of the second recess that faces the substrate,
    the heat sink comprises a first thickness along the thickness direction, which is defined as a distance from the surface of the first recess that faces the substrate to a surface of the heat sink that faces away from the substrate,
    the heat sink comprises a second thickness along the thickness direction, which is defined as a distance from the surface of the second recess that faces the substrate to the surface of the heat sink that faces away from the substrate,
    the second thickness is greater than the first thickness,
    a sum of the first thickness and the first depth is equal to a sum of the second thickness and the second depth,
    the heat sink directly contacts the first surface of the substrate, and the first recess receives the plurality of tall components such that the plurality of tall components are enclosed by the first recess and the substrate, and
    an unoccupied and empty clearance is formed between a surface of the first recess and an outer periphery of the plurality of tall components, except on a substrate-side of the plurality of tall components.

2. The electronic control unit according to claim 1, wherein:
    a surface of the heat sink that faces the first surface of the substrate is in direct contact with the first surface of the substrate.

3. The electronic control unit according to claim 1, wherein:
    the unoccupied and empty clearance is formed around the entire outer periphery of the plurality of tall components except on the substrate-side of the plurality of tall components.

4. The electronic control unit according to claim 1, wherein:
    the unoccupied and empty clearance is evenly formed.

5. The electronic control unit according to claim 1, wherein:
    the first recess is formed linearly in conformity with exterior shapes of the plurality of tall components.

6. The electronic control unit according to claim 1, wherein:
    a metal surface of the heat sink directly contacts the first surface of the substrate.

7. The electronic control unit according to claim 1, wherein:
    an inner periphery of the cover is in contact with an outer periphery of the heat sink.

8. The electronic control unit according to claim 1, wherein:

the heat sink collectively accommodates the tall components and the semiconductor switching element.

9. The electronic control unit according to claim 1, wherein:
the cover comprises a closed-end cylindrical shape.

10. The electronic control unit according to claim 9, wherein:
the substrate is enclosed within the cover.

11. The electronic control unit according to claim 10, wherein:
the heat sink comprises peripheral edges when viewed along the thickness direction, and
the cover covers a plurality of the peripheral edges of the heat sink.

12. An electromotive power steering system for a vehicle comprising:
an electronic control unit comprising:
a substrate;
a plurality of electronic components that are mounted on the substrate and include:
an integrated circuit;
a semiconductor switching element; and
a plurality of tall components that are taller than the integrated circuit and the semiconductor switching element, the plurality of tall components on a side of the substrate;
a heat sink formed from metal positioned on and contacting a first surface of the substrate;
a cover mounted on an opposite side of the substrate than the heat sink, the cover positioned over a second surface of the substrate that is opposite to the first surface and configured to cover the second surface of the substrate; and
a connector positioned on the first surface of the substrate,
wherein
the integrated circuit is mounted on the opposite side of the substrate than the heat sink,
the cover covers the integrated circuit,
the plurality of electronic components include a semiconductor switching element,
the semiconductor switching element is mounted on a surface of the substrate on the heat sink-side, or on a surface of the substrate on an opposite side of the substrate from the heat sink,
the plurality of tall components and the semiconductor switching element constitute a circuit through which an electric current flows from a power supply of the vehicle to a motor of the electromotive power steering system,
the plurality of tall components and the semiconductor switching element are mounted on the first surface of the substrate,
the plurality of tall components includes at least one of a coil, a mechanical relay, and a capacitor,
the integrated circuit and a microcomputer control operations of the plurality of tall components and the semiconductor switching element to control drive of the motor,
the heat sink includes a first recess, a second recess, and a third recess,
the first recess faces the first surface of the substrate and is configured to receive-one or more of the plurality of tall components,
the second recess faces the first surface of the substrate and is configured to receive one or more of a plurality of short components,
the third recess faces the first surface of the substrate and is configured to receive the connector,
the first recess comprises a first depth, which is defined as a distance in a thickness direction of the heat sink from a surface of the heat sink that contacts the substrate to a surface of the first recess that faces the substrate,
the second recess comprises a second depth, which is defined as a distance in the thickness direction of the heat sink from a surface of the heat sink that contacts the substrate to a surface of the second recess that faces the substrate,
the one or more of the plurality of short components being shorter than the one or more of the plurality of tall components,
the heat sink comprises a first thickness along the thickness direction, which is defined as a distance from the surface of the first recess that faces the substrate to a surface of the heat sink that faces away from the substrate,
the heat sink comprises a second thickness along the thickness direction, which is defined as a distance from the surface of the second recess that faces the substrate to the surface of the heat sink that faces away from the substrate,
the second thickness is greater than the first thickness,
a sum of the first thickness and the first depth is equal to a sum of the second thickness and the second depth,
the heat sink directly contacts the first surface of the substrate,
the first recess receives the one or more of the plurality of tall components such that the one or more of the plurality of tall components are enclosed by the first recess and the substrate, and the first recess receives the one or more of the plurality of short components such that the one or more of the plurality of short components are enclosed by the second recess and the substrate,
an unoccupied and empty clearance is formed between a surface of the first recess and an outer periphery of the one or more of the plurality of tall components, except on a substrate-side of the one or more of the plurality of tall components, and
the electronic control unit further comprising a heat conduction component that is provided between the second recess and the outer periphery of the one or more of the plurality of short components except on the substrate-side of the one or more of the plurality of short components.

13. The electromotive power steering system according to claim 12, wherein:
the substrate includes:
a tall region on which the plurality of tall components are mounted;
a switching region on which the semiconductor switching element is mounted; and
a control region on which the integrated circuit and the microcomputer are mounted; and
the heat sink includes the first recess at a position corresponding to the tall region of the substrate.

14. The electromotive power steering system according to claim 13, wherein
the first recess is disposed at a position that corresponds to the tall region of the substrate; and
the second recess is disposed at a position that corresponds to the switching region of the substrate.

15. The electromotive power steering system according to claim 12, wherein:

the one or more of the plurality of short components include a plurality of short components, and the second recess collectively receives the one or more of the plurality of short components, each of which is the semiconductor switching element.

16. The electromotive power steering system according to claim 12, wherein:
a depth of the first recess is deeper than a depth of the second recess.

17. The electromotive power steering system according to claim 12, wherein:
a metal surface of the heat sink directly contacts the first surface of the substrate.

18. The electromotive power steering system according to claim 12, wherein:
the heat sink collectively accommodates the tall components and the semiconductor switching element.

19. The electromotive power steering system according to claim 18, wherein:
an inner periphery of the cover is in contact with an outer periphery of the heat sink.

20. The electromotive power steering system according to claim 1, wherein:
the cover comprises a closed-end cylindrical shape.

21. The electromotive power steering system according to claim 20, wherein:
the substrate is enclosed within the cover.

22. The electromotive power steering system according to claim 21, wherein:
the heat sink comprises peripheral edges when viewed along the thickness direction, and
the cover covers a plurality of the peripheral edges of the heat sink.

* * * * *